United States Patent
Suzuki

(10) Patent No.: US 7,705,308 B2
(45) Date of Patent: Apr. 27, 2010

(54) IMAGE PICKUP APPARATUS INCLUDING IMAGE PICKUP DEVICES HAVING SENSITIVITY IN INFRARED REGION

(75) Inventor: Kazuhiro Suzuki, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/071,977

(22) Filed: Feb. 28, 2008

(65) Prior Publication Data
US 2008/0203305 A1 Aug. 28, 2008

(30) Foreign Application Priority Data
Feb. 28, 2007 (JP) ............................. 2007-050100

(51) Int. Cl.
*G01J 5/00* (2006.01)
(52) U.S. Cl. .................................................. 250/338.1
(58) Field of Classification Search ............. 250/208.1, 250/226, 338.1, 339.01, 339.02, 339.05
See application file for complete search history.

(56) References Cited

U.S. PATENT DOCUMENTS 7,199,348 B2 * 4/2007 Olsen et al. ............... 250/208.1
2005/0029456 A1 * 2/2005 Eggers et al. ............. 250/339.02
2005/0133690 A1 * 6/2005 Higashitsutsumi ........ 250/208.1
2006/0186322 A1 * 8/2006 Matsuyama .................. 250/226
2006/0208169 A1 * 9/2006 Breed et al. .................. 250/221
2008/0001065 A1 * 1/2008 Ackland ..................... 250/208.1

FOREIGN PATENT DOCUMENTS

JP 06-105319 4/1994

* cited by examiner

*Primary Examiner*—David P Porta
*Assistant Examiner*—Djura Malevic
(74) *Attorney, Agent, or Firm*—McDermott Will & Emery LLP

(57) ABSTRACT

A plurality of first pixels receive both visible light and infrared light. A plurality of second pixels receive infrared light. A ratio calculation unit calculates the ratio of an output signal of another first pixel different from saturated first pixel and an output signal of a second pixel corresponding to the another first pixel. A signal estimation unit multiplies the output signal of a second pixel corresponding to the saturated first pixel, by the ratio calculated by the ratio calculation unit. A subtractor subtracts the output of a second pixel corresponding to the saturated first pixel, from a signal estimated as an output signal of the saturated first pixel.

10 Claims, 4 Drawing Sheets

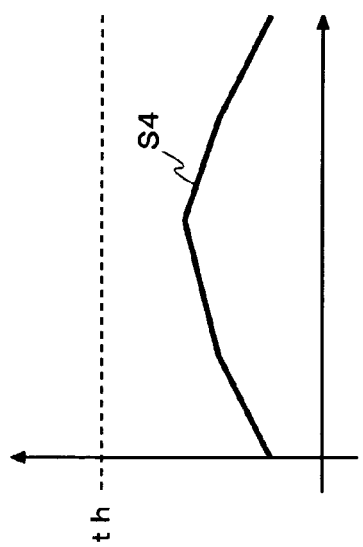
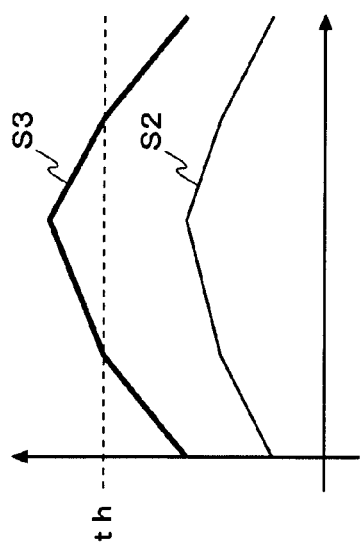
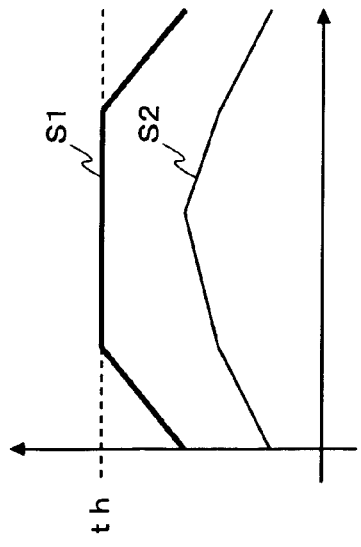

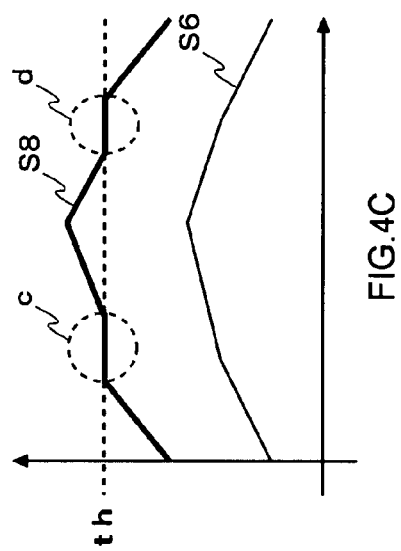
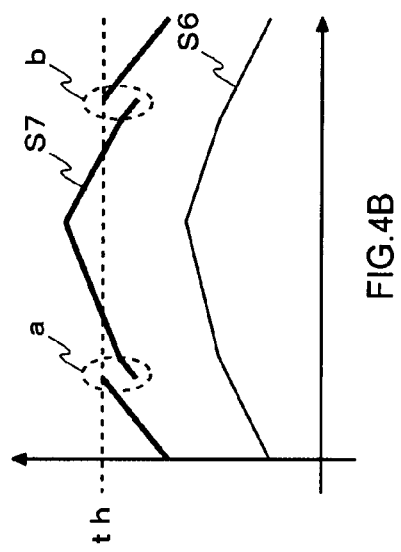
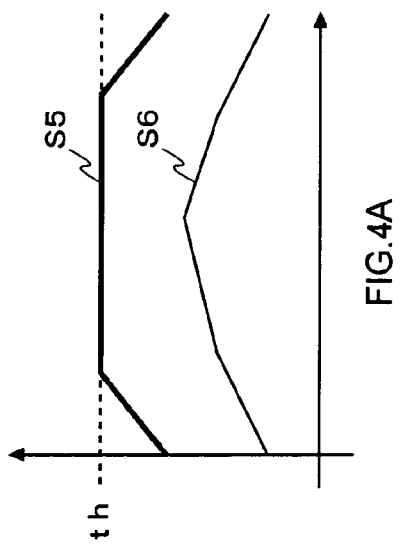

IMAGE PICKUP APPARATUS INCLUDING IMAGE PICKUP DEVICES HAVING SENSITIVITY IN INFRARED REGION

CROSS-REFERENCE TO RELATED APPLICATIONS

This application is based upon and claims the benefit of priority from the prior Japanese Patent Application No. 2007-050100, filed on Feb. 28, 2007, the entire contents of which are incorporated herein by reference.

BACKGROUND OF THE INVENTION

1. Field of the Invention

The present invention relates to an image pickup apparatus including image pickup devices having sensitivity, namely a detection range, in a visible light region and an infrared light region.

2. Description of the Related Art

Generally, image pickup devices such as CCDs (Charge-Coupled Device) and CMOS (Complementary Metal-Oxide Semiconductor) sensors have sensitivity in not only visible light but also infrared light. When an infrared cut filter is not used, such image pickup devices output signals where the visible light and the infrared light are mixed together. Such signals have lighter color and therefore the color reproducibility thereof is low.

However, depending on the characteristics of the image pickup devices and how an analog-to-digital conversion processing is performed, a pixel value reaches a saturation value in a spot brighter than a certain level. In such a case, actual luminance may not come out properly. When infrared light components are subtracted from such saturated pixel values, the pixel value after the subtraction is unduly dark and subducting and therefore such a spot appears as noise.

SUMMARY OF THE INVENTION

An image pickup apparatus according to one embodiment of the present invention comprises: a plurality of first pixels which receive both visible light and infrared light; a plurality of second pixels which receive infrared light corresponding respectively to the plurality of first pixels; and a processing unit which obtains a component of visible light incident on first pixel saturated with the light, by using a relation between an output signal of another first pixel different from the saturated first pixel among the plurality of first pixels and an output signal of a second pixel corresponding to said another first pixel.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIGS. 3A to 3C illustrate a first transition example of image signals in an image pickup apparatus according to an embodiment of the present invention; FIG. 3A illustrates a visible light component+infrared light component signal and an infrared light signal obtained from an image pickup device; FIG. 3B illustrates a visible light component+infrared light component signal estimated by a signal estimation unit and an infrared light signal obtained from an infrared pixel; and FIG. 3C illustrates a signal obtained after subtraction; and FIGS. 4A to 4C illustrate a second transition example of image signals in an image pickup apparatus according to an embodiment of the present invention; FIG. 4A illustrates a visible light component+infrared light component signal and an infrared light signal obtained from an image pickup device; FIG. 4B illustrates a visible light component+infrared light component signal estimated by a signal estimation unit and an infrared light signal obtained from an infrared pixel; and FIG. 4C illustrates a visible light component+infrared light component signal obtained after correction and an infrared light signal obtained from an infrared light pixel.

DETAILED DESCRIPTION OF THE INVENTION

Figure 1:
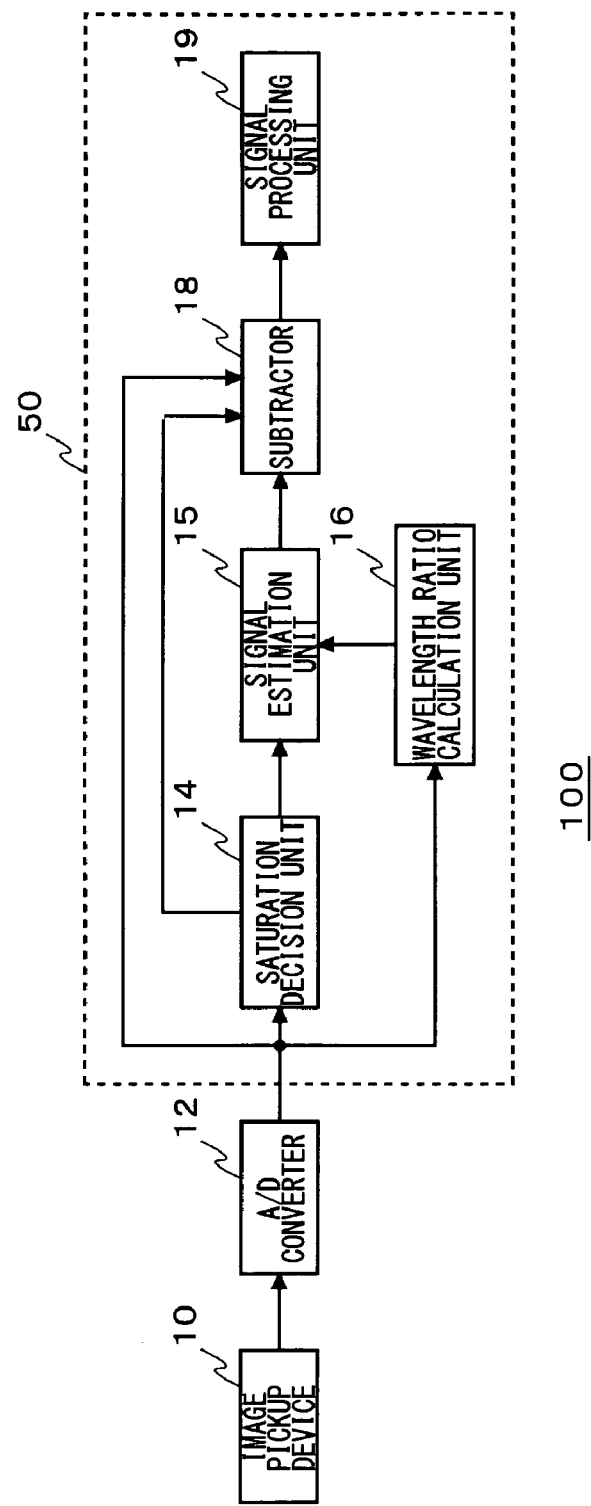
FIG. 1 illustrates a structure of an image pickup apparatus according to an embodiment of the present invention.

The invention will now be described by reference to the preferred embodiments. This does not intend to limit the scope of the present invention, but to exemplify the invention.

A description of a typical embodiment will be given before describing a detailed description of embodiments of the present invention. An image pickup apparatus according to one embodiment of the present invention comprises: a plurality of first pixels which receive both visible light and infrared light; a plurality of second pixels which receive infrared light corresponding respectively to the plurality of first pixels; and a processing unit which obtains a component of visible light incident on first pixel saturated with the light, by using a relation between an output signal of another first pixel different from the saturated first pixel among the plurality of first pixels and an output signal of a second pixel corresponding to said another first pixel. The "another pixel" may be an unsaturated pixel.

According to this embodiment, a normal visible light component incident on the saturated first pixels is estimated from the other pixels, so that images which are free from a white-out effect and with reduced noise can be obtained.

The processing unit may include: a ratio calculation unit which calculates a ratio of the output signal of another first pixel and the output signal of a second pixel corresponding to said another first pixel; a signal estimation unit which multiplies the output signal of a second pixel corresponding to the saturated first pixel, by the ratio calculated by the ratio calculation unit; and a subtractor which subtracts the output of a second pixel corresponding to the saturated first pixel, from a signal obtained from a resulting multiplication in the signal estimation unit. According to this embodiment, if the first pixel has an ideal characteristic that the saturation does not occur, the signal containing a visible light component and an infrared light component which are to be outputted from the first pixel will be estimated and then the infrared light component will be subtracted therefrom so as to obtain the visible light component.

The processing unit may further include a saturation decision unit which determines whether the output signal of the first pixel is saturated or not. When an estimated signal is less than a saturation value of the first pixel after estimation of the output signal of the first pixel which has been determined to be saturated by the saturation decision unit, the signal estimation unit may output a signal having a value greater than or equal to the saturation value. According to this embodiment, if it is determined that the estimated signal is erroneous due to the factors that include a difference of objects in between a pixel on which the estimation is based and a targeted pixel, noise and effects of averaging processing and the like, the estimation accuracy can be enhanced by correcting the estimation result.

The ratio calculation unit may calculate the ratio of the output signal of another first pixel which is estimated to have at least one of an object and a light source common to the saturated first pixel and the output signal of a second pixel corresponding to said another first pixel. According to this embodiment, the estimation accuracy can be enhanced. The ratio calculation unit may calculate the ratio of a first pixel adjacent to the saturated first pixel and a second pixel corresponding to said first pixel.

The first pixel and the second pixel may be formed on the same image pickup device. As a result, a single image pickup device suffices. And the need of an optical device to retrieve the infrared light component is eliminated, so that the size of the image pickup apparatus can be made smaller.

Arbitrary combinations of the aforementioned constituting elements, and the implementation of the present invention in the form of a method, an apparatus, a system, a program and so forth may also be effective as and encompassed by the embodiments of the present invention.

Hereinbelow, a description is given of the best modes to carry out the present invention.

FIG. 1 illustrates a general structure of an image pickup apparatus 100 according to an embodiment of the present invention. This structure may be implemented hardwarewise by elements such as a CPU, memory and other LSIs of an arbitrary computer, and softwarewise by memory-loaded programs or the like. Depicted herein are functional blocks implemented by cooperation of hardware and software. Therefore, it will be obvious to those skilled in the art that the functional blocks may be implemented by a variety of manners including hardware only, software only or a combination of both.

The image pickup apparatus 100 includes an image pickup device 10, an analog-to-digital converter 12, and a processing unit 50. The processing unit 50 includes a saturation decision unit 14, a signal estimation unit 15, a wavelength ratio calculation unit 16, a subtractor 18, and a signal processing unit 19. The light from an object enters the image pickup device 10.

The image pickup device 10, which includes CCDs or CMOS sensors, for instance, is provided with photodiodes arranged in a matrix wherein the respective photodiodes constitute pixels.

The image pickup device 10 is provided with different color filters for each pixel, and these filters separate colors. A color filter provided in the image pickup device 10 includes visible light filters that transmit the visible light and the infrared light and an infrared filter that mainly transmits the infrared light. Further, the visible light filters are classified into a red filter, a green filter and a blue filter depending on the color transmitted.

Figure 2:
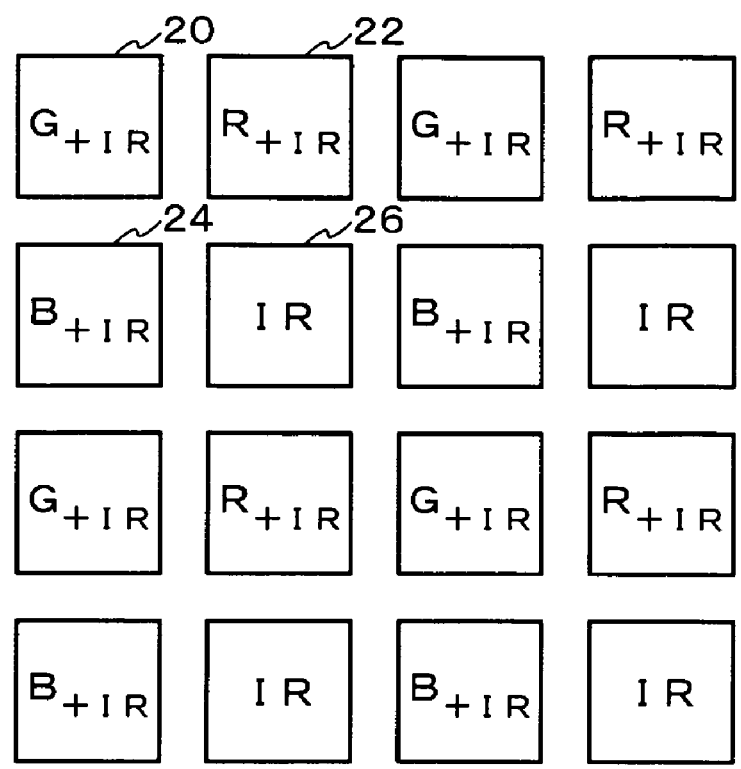
FIG. 2 illustrates an array of color filters provided in an image pickup device.

FIG. 2 illustrates an array of color filters provided in the image pickup device 10. The image pickup device 10 is structured by a combination of four kinds of pixels which are a green pixel 20, a red pixel 22, a blue pixel 24, and an infrared pixel 26. A green filter that transmits the green light is arranged in the green pixel 20; a red filter that transmits the red light is arranged in the red pixel 22; and a blue filter that transmits the blue light is arranged in the blue pixel 24. The green filter, the red filter and the blue filter have characteristics whereby all these three filters transmit the infrared light, too. An infrared light filter that transmits mainly transmits the infrared light is arranged in the infrared light pixel 26. The green filter, the red filter, the blue filter and the infrared light filter are each composed of 2 pixels by 2 pixels, and they are arranged repeatedly to form an array.

The image pickup device 10 converts the light that has transmitted a corresponding filter for each pixel into an electric signal associated with its intensity. For each pixel, the thus converted signal is outputted sequentially as an image signal. That is, the size of the image signal outputted from the green pixel 20 is equivalent to the size of the green light component and the infrared light component combined together. Similarly, the size of the image signal outputted from the red pixel 22 is equivalent to the size of the red light component and the infrared light component combined together. Similarly, the size of the image signal outputted from the blue pixel 24 is equivalent to the size of the blue light component and the infrared light component combined together. On the other hand, the size of the image signal outputted from the infrared light pixel 26 is equivalent to the size of the infrared light component. The image signal outputted from this infrared light pixel 26 is used mainly to correct the image signals outputted from the corresponding green pixel 20, red pixel 22 and blue pixel 24.

Referring back to FIG. 1, the analog-to-digital converter 12 converts the image signal outputted from the image pickup device 10 into 10-bit digital signal, for instance. The analog-to-digital converter 12 outputs the signals, where the image signals outputted from the green pixels 20, the red pixels 22 and the blue pixels 24 have been converted into digital signals, to the saturation decision unit 14 and the wavelength ratio calculation unit 16. The analog-to-digital converter 12 outputs the signals, where the image signals outputted from the infrared pixels 26 have been converted into digital signals, to the subtractor 18 and the wavelength ratio calculation unit 16.

The saturation decision unit 14 determines whether the image signals outputted from the green pixel 20, the red pixel 22 and the blue pixel 24, namely a green light component+infrared light component ($G_{+IR}$), a red light component+infrared light component ($R_{+IR}$) and a blue light component+infrared light component ($B_{+IR}$) (hereinafter these will be generically referred to as "visible light component+infrared light component signal" as appropriate) has reached a saturation value or not. This saturation value is set in consideration of saturation characteristics of photodiodes used in the image pickup device 10, conversion loss at the time of analog-to-digital conversion, attenuation at the time of signal channel propagation or the like. As a result of the above decision, the saturation decision unit 14 outputs unsaturated image signals to the subtractor 18 and outputs saturated image signals to the signal estimation unit 15.

If the image pickup device 10 is assumed to be an ideal device that will not saturate, the signal estimation unit 15 will estimate image signals which will be primarily obtained from the green pixel 20, the red pixel 22 and the blue pixel 24. A specific estimation method will be discussed later.

The wavelength ratio calculation unit 16 calculates the ratio of the infrared light signal outputted from the infrared pixel 26 and the visible light component+the infrared light component signal outputted from the green pixel 20, the red pixel 22 and the blue pixel 24. The thus calculated ratio is set in the signal estimation unit 15. A specific calculation method will be discussed later.

The subtractor 18 subtracts the infrared light signal outputted from the corresponding infrared light pixel 26, from an estimation signal inputted from the signal estimation unit 15. As a result, the infrared light component is removed and therefore an image signal left with the visible light components alone can be generated. The infrared light signal outputted from the corresponding infrared light pixel 26 is subtracted from the unsaturated image signal inputted from the saturation decision unit 14.

The signal processing unit 19 extracts luminance signals and color signals from and performs various image processings on the signals outputted from the saturation decision unit 14 and the subtractor 18. The signal processing unit 19 transmits the signals, on which the image processings have been performed, to a display unit, an image compression apparatus or the like (not shown).

A description is now given of an estimation method in the signal estimation unit 15 together with a ratio calculation method in the wavelength ratio calculation unit 16.

Using the following equation (1), the signal estimation unit 15 generates an estimation signal which would have primarily been estimated to be obtained from the green pixel 20, the red pixel 22 and the blue pixel 24.

(Estimation signal of a targeted pixel) = (Equation 1)

(Infrared light signal of an infrared light pixel associated with the targeted pixel) ×

{(Visible light component + infrared light component signal of a pixel for use in ratio calculation) /

(infrared light signal of an infrared light pixel associated with the pixel for use in ratio calculation)}

The wavelength ratio calculation unit 16 calculates the ratio of the visible light component+the infrared light signal obtained from the green pixel 20, the red pixel 22 and the blue pixel 24 to the infrared light signal obtained from the corresponding infrared light pixels, and sets the calculated ratio in the signal estimation unit 15. The signal estimation unit 15 multiplies this ratio by the infrared light signal outputted from the infrared pixel 26 corresponding to the targeted pixel, and then generates the above-described estimation signal.

The wavelength ratio calculation unit 16 calculates the above-described ratio, based on the entire image or pixels in the vicinity of the targeted pixel. An image to be used may be a frame which is being currently processed or a frame before said frame. Or a frame, which is obtained after a few frames before said frame have been averaged, may be used. The optical reflectance of each wavelength is dependent on a material body or the quality of material. Thus, it is preferable that a pixel region on which the above-described ratio calculation should be based be a region lying within a range. The range where the same material body or the same quality of material as the targeted pixel is picked up is detected by a body detection processing or material. For example, in a case where the image pickup apparatus 100 is equipped with an auto-focus mechanism and thus the distance between the image pickup apparatus 100 and an object can be calculated or in a case where it is equipped with an edge detection function, the range in which the same material body or the same quality of material as the targeted pixel is picked up can be identified using one of the functions. To simplify a design, a pixel or pixels lying within a certain distance from the targeted pixel may be used.

If the current frame is used as a basis on which the above-described ratio is calculated, the above-described calculation processing for the ratio and the above-described generation processing for the estimation signal will be required for the same frame. In such a case, when calculating the above-described ratio, the wavelength ratio calculation unit 16 stores a targeted frame in a not-shown memory and then the signal estimation unit 15 reads out the targeted frame from the memory so as to carry out calculation necessary for the generation of the above-described estimation signal.

FIGS. 3A to 3C illustrate a first transition example of image signals in the image pickup apparatus 100 according to an embodiment of the present invention. The vertical axis in each of FIGS. 3A to 3C indicates an amount of signals obtained after photoelectric conversion, whereas the horizontal axis therein indicates a spatial position. FIG. 3A illustrates a visible light component+infrared light component signal S1 and an infrared light signal S2 obtained from the image pickup device 10. The visible light component+infrared light component signal S1 has a region which has reached a saturation value th. In such a pixel, the visible light component+infrared light component signal S1 thereof is smaller than a normal value. Thus, simply subtracting the infrared light signal S2 results in an excessive subtraction and thus the pixel value may becomes unduly dark and subducting. In contrast thereto, if no subtraction is done, the infrared light component will stay on and the pixel will be an bright point. Though conceivable is that a saturated region undergoes no subtraction and an unsaturated region only undergoes subtraction, a wide difference in brightness occurs in the signal after subtraction.

FIG. 3B illustrates a visible light component+infrared light component signal S3 estimated by the signal estimation unit 15 and an infrared light signal S2 obtained from an infrared pixel 26. The visible light component+infrared light component signal S3 is a signal where a normal value in a saturation region is estimated, and it is a signal larger than the visible light component+infrared light component signal S1. FIG. 3C illustrates a signal S4 obtained after subtraction. In this manner, when the infrared light signal S2 is subtracted from the estimated visible light component+infrared light component signal S3, a naturally continuous signal S4 can be obtained.

The ratio that the wavelength ratio calculation unit 16 calculates is an average ratio for the region used in the calculation. Thus a discrepancy occurs between the value estimated using the above ratio and an actual value.

FIGS. 4A to 4C illustrates a second transition example of image signals in the image pickup apparatus 100 according to an embodiment of the present invention. This second transition example is an exemplary processing where the discrepancy between the estimated value and the actual value is corrected.

FIG. 4A illustrates a visible light component+infrared light component signal S5 and an infrared light signal S6 obtained from the image pickup device 10. The visible light component+infrared light component signal S5 has a region which has reached a saturation value th.

FIG. 4B illustrates a visible light component+infrared light component signal S7 estimated by the signal estimation unit 15 and an infrared light signal S6 obtained from an infrared pixel 26. In the estimated visible light component+infrared light component signal S7, there are unsaturated regions a and b even though these regions are supposed to be saturated.

FIG. 4C illustrates a visible light component+infrared light component signal S8 obtained after correction and an infrared light signal S6 obtained from the infrared light pixel 26. Since the above-mentioned regions a and b are at least saturated regions, the values of the regions a and b are corrected to the saturation value th or more. In FIG. 4C, the values of regions c and d are corrected to the saturation value th.

As explained above, according to the present embodiment, the noise generated by subtracting the infrared light component more than necessary can be reduced. That is, for such a case where the infrared light signal is subtracted from the signal suffering from a white-out effect as a result of saturation, the undue reduction of the amount of signals can be prevented. Also, for a such case where the infrared light component is subtracted from the unsaturated regions only, the occurrence of a wide difference or unevenness in brightness in the vicinity of white-out effected regions can be prevented. Also, since the infrared light cut filter is not used, the visible light component that is required is not attenuated because of the infrared light cut filter and therefore the reduction in sensitivity can be prevented. According to the present embodiment, the visible light component+infrared light component signal in the saturated pixels can be estimated with accuracy, and the processing of subtracting the infrared light signal from the visible light component+infrared light component signal can be performed with accuracy. Thus smooth and natural visible light component signals can be obtained.

The description of the present invention given above is based upon illustrative embodiments. These exemplary embodiments are intended to be illustrative only and it will be obvious to those skilled in the art that various modifications to constituting elements and processes could be developed and that such modifications are also within the scope of the present invention.

In the calculation processing performed by the signal estimation unit 15, if the infrared light signal is multiplied by the above-described ratio, the noise will also increase in a pixel having large noise. The signal estimation unit 15 may replace the visible light component+infrared light component signal obtained from such a pixel by a visible light component+ infrared light component obtained from a pixel adjacent to said pixel or an average value of visible light component+ infrared light component signals obtained from a plurality of adjacent pixels. Also, instead of the visible light component+ infrared light component signal, an infrared light signal may be calculated using an adjacent pixel so as to calculate a visible light component+infrared light component signal from the thus calculated infrared light signal.

The signal estimation unit 15 determines whether a pixel has large noise or not, by using the following equation (2), for instance:

$$\text{(Criterion value)} = \text{(difference between a targeted pixel and an adjacent pixel)} - A \times \sum \text{(difference between a pixel adjacent to the targeted pixel and a pixel adjacent thereto)} \quad \text{(Equation 2)}$$

Coefficient A determines severity of decision. Thus when A is set to a relatively small value, it is likely to be determined that the pixel has a large noise, whereas when A is set to a relatively large value, it is unlikely that the pixel has a large noise. When the criterion value in the above equation (2) is positive, the signal estimation unit 15 determines that the noise is large; and when it is negative, the signal estimation unit 15 determines that the noise is small. With such processings, a substitution signal generated from the adjacent pixel is used for a pixel whose noise has been determined to be large. Thus the noise of an entire image can be reduced.

In the above-described embodiments, the ratio of the visible light component+infrared light component signal and the infrared light signal is calculated. The ratio to be multiplied in the signal estimation unit 15 is not limited thereto. For example, in a structure where an infrared cut filter is provided only in a partial region of the image pickup device 10, the ratio of the visible light component light signal, obtained from a pixel provided with the infrared cut filter, and the infrared light signal may be calculated. In such a case, the infrared light signal is multiplied by this ratio, so that the visible light component signal can be directly estimated, thus eliminating the processing of subtracting the infrared light signal. Also, a wavelength-dependent sensor may be provided outside the image pickup device 10 and the ratio to be multiplied in the signal estimation unit 15 may be calculated using an output result from the sensor.

In the above-described embodiments, the infrared light signal is multiplied by the above-described ratio on the assumption that the infrared light component and the visible light component vary in the same ratio. In view of this, the difference between the visible light component+infrared light component signal and the infrared light signal may be added to or subtracted from the infrared light signal on the assumption that the visible light component and the visible light component vary in the same difference. Also, the normal signal may be estimated by combining the ratio and the difference. When the ratio and the difference are combined, the weighting may be varied depending on the brightness, a light source or an object. Also, the ratio and the difference may be switched as appropriate and used.

For example, in a system where the infrared light is irradiated from a monitoring camera or the like and the reflected light of the infrared light is returned to part of a region within a picked-up image, the infrared light signal on said region is more added, by an amount corresponding to the irradiated infrared light, than other regions. In this manner, the infrared light component contained in part of the image is estimated from the difference, and the infrared light components contained in the entire image are estimated from the ratio. Thus the infrared light component contained in the visible light component+infrared light component signal can be estimated with accuracy. In a digital still camera, a digital video camera and the like, a calculation method applied to the infrared light signal may be optimized according a selected mode, such as a landscape mode or portrait mode. A designer may determine this calculation method based on experiments or simulation runs.

In the above-described embodiments, a description has been given of the image pickup device 10 that uses three primary color filters and an infrared light filter. In this respect, the present embodiments are also applicable to the image pickup device 10 that uses complementary color filters and an infrared light filter. The complementary filter separates the colors into yellow (Ye), cyan (Cy) and magenta (Mg). Or, the incident light is color-separated into yellow (Ye), cyan (Cy) and green (Gr). Or, the incident light is color-separated into yellow (Ye), cyan (Cy), magenta (Mg) and green (Gr). Similar to the above-described three primary color filters, the filters that transmit the respective color components also transmit the infrared light component.

While the preferred embodiments of the present invention have been described using specific terms, such description is for illustrative purposes only, and it is to be understood that changes and variations may be further made without departing from the spirit or scope of the appended claims.

What is claimed is:

1. An image pickup apparatus comprising:
a plurality of first pixels which receive both visible light and infrared light;
a plurality of second pixels which receive infrared light corresponding respectively to the plurality of first pixels; and
a processing unit which obtains a component of visible light incident on a first pixel saturated with the light, by using a relation between an output signal of another unsaturated first pixel different from the saturated first pixel among the plurality of first pixels and an output signal of a second pixel corresponding to said another first pixel,
wherein said processing unit includes:
a ratio calculation unit which calculates a ratio of the output signal of another first pixel to the output signal of a second pixel corresponding to said another first pixel;
a signal estimation unit which multiplies the output signal of a second pixel corresponding to the saturated first pixel, by the ratio calculated by the ratio calculation unit; and
a subtractor which subtracts the output of a second pixel corresponding to the saturated first pixel, from a signal obtained from a resulting multiplication in the signal estimation unit.

2. An image pickup apparatus according to claim 1, said processing unit further including a saturation decision unit which determines whether the output signal of the first pixel is saturated or not, and
wherein when an estimated signal is less than a saturation value of the first pixel after estimation of the output signal of the first pixel which has been determined to be saturated by the saturation decision unit, said signal estimation unit outputs a signal having a value greater than or equal to the saturation value.

3. An image pickup apparatus according to claim 2, wherein the first pixels and the second pixels are formed on the same image pickup device.

4. An image pickup apparatus according to claim 1, wherein said ratio calculation unit calculates the ratio of the output signal of another first pixel which is estimated to have at least one of an object and a light source common to the saturated first pixel and the output signal of a second pixel corresponding to said another first pixel.

5. An image pickup apparatus according to claim 4, wherein the first pixels and the second pixels are formed on the same image pickup device.

6. An image pickup apparatus according to claim 1, wherein the first pixels and the second pixels are formed on the same image pickup device.

7. An image pickup apparatus according to claim 1, wherein the first pixels and the second pixels are formed on the same image pickup device.

8. An image pickup apparatus according to claim 1, wherein said another first pixel is an unsaturated pixel.

9. An image pickup apparatus according to claim 1, wherein said another first pixel is an unsaturated pixel.

10. An image pickup apparatus comprising:
a plurality of first pixels which receive both visible light and infrared light;
a plurality of second pixels which receive infrared light corresponding respectively to the plurality of first pixel; and
a processing unit which obtains a component of visible light incident on a first pixel saturated with the light, by using a relation between an output signal of another unsaturated first pixel different from the saturated first pixel among the plurality of first pixels and an output signal of a second pixel corresponding to said another first pixel,
wherein said processing unit includes:
a calculation unit which calculates a difference between the output signal of another first pixel and the output signal of a second pixel corresponding to said another first pixel;
a signal estimation unit which adds the difference calculated by the calculation unit, to the output signal of a second pixel corresponding to the saturated first pixel; and
a subtractor which subtracts the output of a second pixel corresponding to the saturated first pixel, from a signal obtained from a resulting addition in said signal estimation unit.

* * * * *